United States Patent
Pixley et al.

(10) Patent No.: US 10,643,823 B2
(45) Date of Patent: May 5, 2020

(54) FOAM IN ION IMPLANTATION SYSTEM

(71) Applicant: Varian Semiconductor Equipment Associates, Inc., Gloucester, MA (US)

(72) Inventors: James Alan Pixley, Dover, NH (US); Eric D. Hermanson, Georgetown, MA (US); Philip Layne, Salem, MA (US); Lyudmila Stone, Lynnfield, MA (US); Thomas Stacy, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 16/161,989

(22) Filed: Oct. 16, 2018

(65) Prior Publication Data
US 2020/0083027 A1    Mar. 12, 2020

Related U.S. Application Data

(60) Provisional application No. 62/728,429, filed on Sep. 7, 2018.

(51) Int. Cl.
| | |
|---|---|
| *H01J 37/317* | (2006.01) |
| *H01J 37/32* | (2006.01) |
| *H01L 21/265* | (2006.01) |

(52) U.S. Cl.
CPC .... *H01J 37/32651* (2013.01); *H01J 37/3171* (2013.01); *H01L 21/265* (2013.01)

(58) Field of Classification Search
CPC .............. H01J 37/3171; H01J 37/3172; H01J 37/32651

See application file for complete search history.

(56) References Cited

U.S. PATENT DOCUMENTS

| | | |
|---|---|---|
| 6,358,376 B1 | 3/2002 | Wang et al. |
| 6,929,725 B2 | 8/2005 | Friedrich et al. |
| 8,471,476 B2 | 6/2013 | Kurunczi et al. |
| 2007/0158188 A1* | 7/2007 | Ivanov ................ C23C 14/564 |
| | | 204/298.02 |
| 2011/0012033 A1* | 1/2011 | Colvin ..................... H01J 3/40 |
| | | 250/492.21 |
| 2012/0085917 A1* | 4/2012 | Kurunczi .............. H01J 37/026 |
| | | 250/396 ML |

FOREIGN PATENT DOCUMENTS

KR    10-1755970 B1    7/2017

OTHER PUBLICATIONS

International Search Report and Written Opinion dated Dec. 16, 2019 for PCT/US19/48332 filed Aug. 27, 2019.

* cited by examiner

*Primary Examiner* — Eliza W Osenbaugh-Stewart

(57) ABSTRACT

Disclosed is a semiconductor processing apparatus including one or more components having a conductive or nonconductive foam material. In some embodiments, the component is a plasma flood gun including a shield assembly coupled to the plasma flood gun. The shield assembly may include a first shield having a first main side facing an ion beam target, and a connection block coupled to a second main side of the first shield. The shield assembly may further include a mounting plate coupled to the connection block, and a second shield coupled to the mounting plate by a bracket. In some embodiments, the first shield and/or one or more process chamber walls includes a foam material, such as a conductive or nonconductive foam.

20 Claims, 3 Drawing Sheets

FOAM IN ION IMPLANTATION SYSTEM

This application claims priority to U.S. Provisional Patent Application No. 62/728,429 filed Sep. 7, 2018, entitled "Foam in Ion Implantation System," and incorporated by reference herein in its entirety.

FIELD OF THE DISCLOSURE

Embodiments of the present disclosure relate to ion implantation of semiconductor structures. More particularly, embodiments of the present disclosure relate to using conductive or nonconductive foam in an ion implantation system.

BACKGROUND OF THE DISCLOSURE

Ion implantation is a process used to dope impurity ions into a substrate such as, for example, a semiconductor wafer. Generally, an ion beam is directed from an ion source chamber toward a substrate. Different feed gases are supplied to the ion source chamber to obtain plasma used to form ion beams having particular dopant characteristics. For example, from the feed gasses $PH_3$, $BF_3$, or $AsH_3$, various atomic and molecular ions are created within the ion source, and subsequently accelerated and mass selected. The depth of implantation of the generated ions into the substrate is based on the ion implant energy and the mass of the ions. One or more types of ion species may be implanted in the target wafer or substrate in different doses and at different energy levels to obtain desired device characteristics. A precise doping profile in the substrate is essential to proper device operation.

While implanting certain species during the implantation process, sputter from the wafer is reflected back towards the various components of the ion implantation system. Therefore, the components become heavily coated with contaminants/particles, leading to flaking. The flaking often results in elevated particle counts affecting device performance yield.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, an apparatus may include a plasma flood gun, and a shield assembly coupled to the plasma flood gun. The shield assembly may include a first shield having a first main side facing an ion beam target, and a connection block coupled to a second main side of the first shield. The shield assembly may further include a mounting plate coupled to the connection block, and a second shield coupled to the mounting plate by a bracket.

In another embodiment, a shield assembly for a plasma flood gun may include a first shield having a first main side facing an ion beam target, the first shield including a foam material. The shield assembly may further include a connection block coupled to a second main side of the first shield, a mounting plate coupled to the connection block, and a second shield coupled to the mounting plate by a bracket. The bracket further couples together the mounting plate and a housing of the plasma flood gun.

In yet another embodiment, an apparatus may include a plasma flood gun, and a shield assembly coupled to the plasma flood gun. The shield assembly may include a first shield having a first main side facing an ion beam target, wherein the first shield includes a foam material, and a connection block coupled to a second main side of the first shield. The shield assembly may further include a mounting plate coupled to the connection block, and a second shield coupled to the mounting plate by a bracket.

Figure 1:
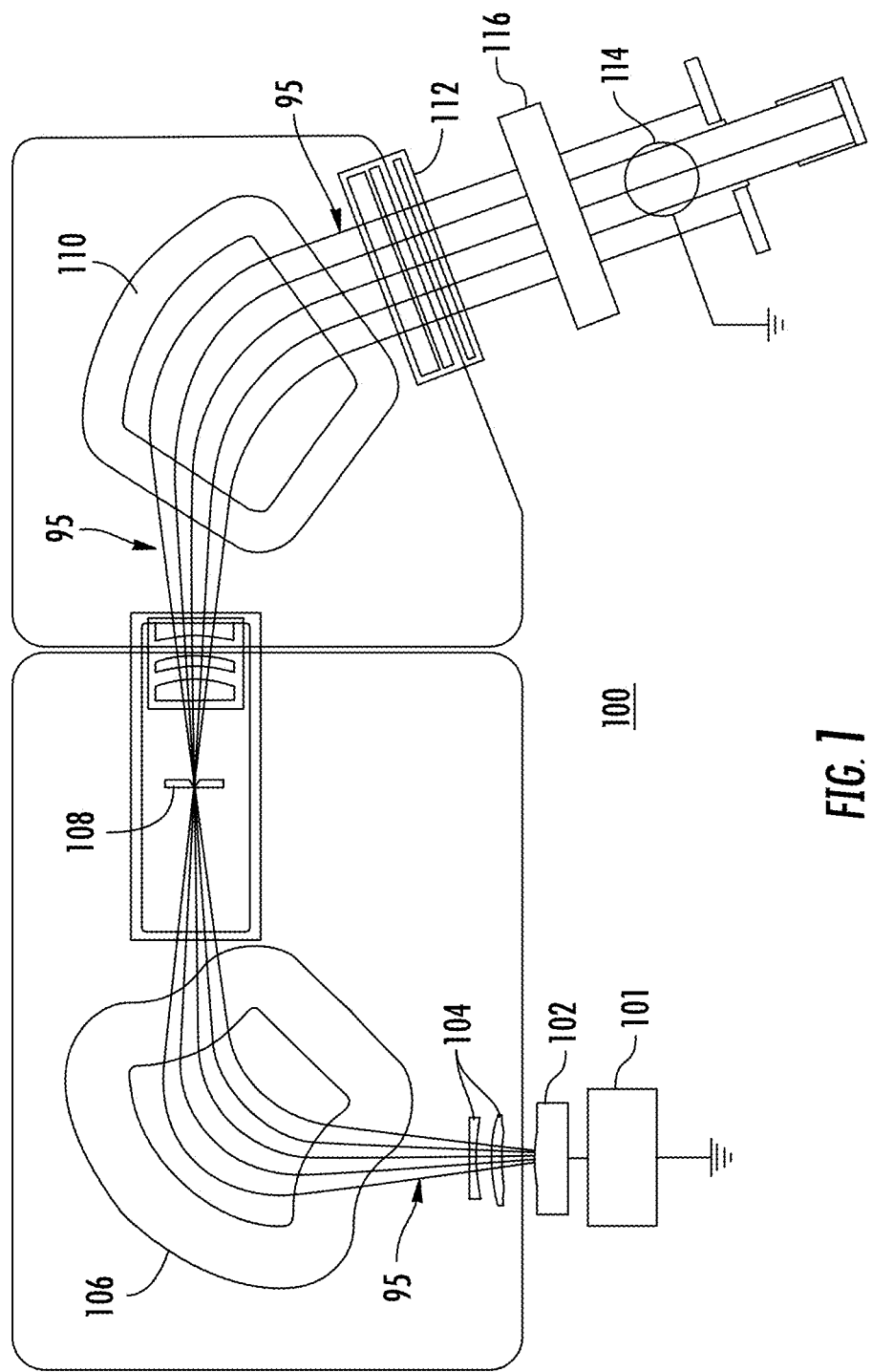
FIG. 1 depicts an ion implanter system incorporating a plasma flood gun assembly in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

A conductive or nonconductive foam for use with apparatuses, shield assemblies, liners, and plasma flood gun assemblies in accordance with the present disclosure will now be described more fully hereinafter with reference to the accompanying drawings, where embodiments of the methods are shown. The apparatuses, shield assemblies, liners, and plasma flood gun assemblies may be embodied in many different forms and are not to be construed as being limited to the embodiments set forth herein. Instead, these embodiments are provided so the disclosure will be thorough and complete, and will fully convey the scope of the system and method to those skilled in the art.

Ion implanters are widely used in semiconductor manufacturing to selectively alter conductivity of materials. In some ion implanters, ions generated from an ion source are directed through a series of beam-line components, for example, including one or more analyzing magnets and a plurality of electrodes. The beam-line components select desired ion species, filter out contaminant species and ions having undesirable energies, and adjust ion beam quality at a target wafer. Suitably shaped electrodes may modify the energy and the shape of an ion beam.

An exemplary ion implanter system 100 is generally shown in FIG. 1 and includes an ion source chamber 102, and a series of beam line components for directing an ion beam 95 to a wafer or substrate. These components are housed in a vacuum environment and configured to provide ion dose levels with high or low energy implantation based on the desired implant profile. In particular, the implanter system 100 includes an ion source chamber (hereinafter "chamber") 102 to generate ions of a desired species. The chamber 102 may have an associated hot cathode powered by power supply 101 to ionize feed gas introduced into the chamber 102 to form charged ions and electrons (plasma). The hot cathode may be, for example, a heated filament or an indirectly heated cathode.

Different feed gases are supplied to the chamber 102 to generate ions having particular dopant characteristics. The ions may be extracted from source chamber 102 via a standard three (3) extraction electrode configuration used to create a desired electric field to focus the ion beam 95 extracted from the chamber 102. The ion beam 95 passes through a mass analyzer chamber 106 having a magnet functioning to pass just ions having the desired charge-to-mass ratio to a resolving aperture. In particular, the analyzer magnet can include a curved path where the ion beam 95 is exposed to the applied magnetic field, causing ions having the undesired charge-to-mass ratio to be deflected away from the beam path. A collimator magnet 110 is positioned downstream of the mass slit 108 and is configured to deflect the ion beam 95 into a ribbon beam having parallel trajectories. A magnetic field may be used to adjust the deflection of the ions via a magnetic coil.

The ion beam 95 is targeted toward a work piece attached to a support or platen 114. A deceleration stage 112 is utilized, and may be disposed between the collimator magnet 110 and the support 114. Deceleration stage 112 (also referred to as an Energy Purity Module, EPM) may be positioned close to a target substrate on the platen 114 and may include a plurality of electrodes (e.g. three) to implant the ions into the target substrate at a desired energy level. Because the ions lose energy when colliding with electrons and nuclei in the substrate, the ion come to rest at a desired depth within the substrate based on the acceleration energy. The ion beam 95 may be distributed over the target substrate by beam scanning, by substrate movement using platen 114, or by a combination of beam scanning and substrate movement. A plasma flood gun (PFG) assembly 116 can be positioned immediately upstream of the platen 114 to apply plasma to the ion beam just before the beam impacts the substrate.

Figure 2:
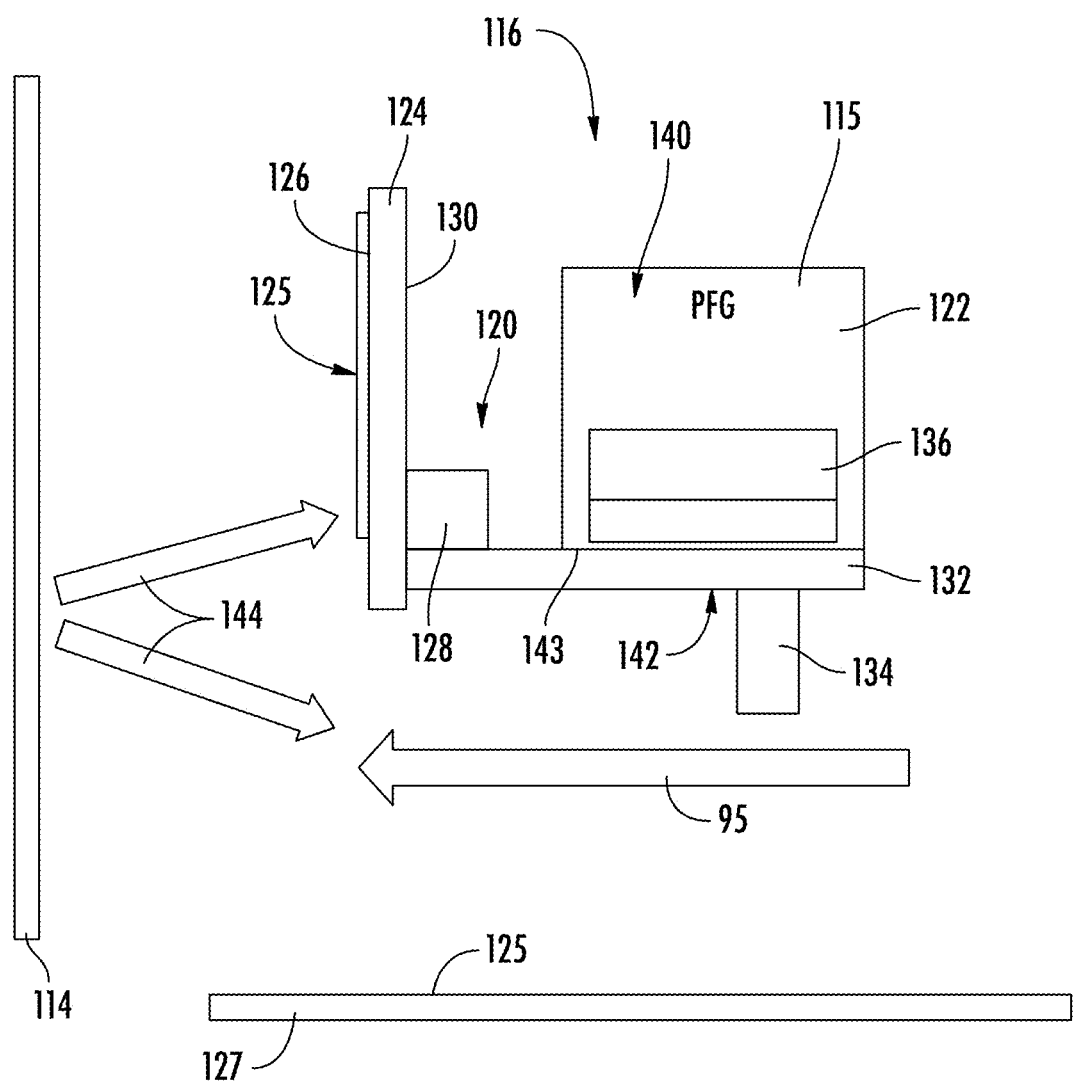
FIG. 2 is an end view of the plasma flood gun assembly of FIG. 1 in accordance with embodiments of the present disclosure.

Referring to FIG. 2, the assembly 116 according to embodiments of the present disclosure will be described in greater detail. During use, the ion beam 95 is delivered to an ion beam target, such as a support or platen 114. The ion beam 95 travels beneath the PFG 115, the PFG 115 includes a main body 140, and is operable to supply a plasma to the ion beam 95. As shown, a second shield 134 of the shield assembly 120 may extend down from a mounting plate 132 to protect exit apertures 142 of a PFG 115. In some embodiments, the second shield 134 and the mounting plate 132 are oriented perpendicular to one another. A connection block 128 may couple together a first shield 124 and the mounting plate 132, for example, along a second main side 130 of the first shield 124. The mounting plate 132 may be coupled to the housing 122 of the PFG 115 by a bracket 136, wherein the bracket 136 may be L-shaped. In some embodiments, the mounting plate 132 partially surrounds a footprint or perimeter 143 of a main body 140 of the PFG 115.

The PFG 115 is often located near the ion beam 95, just before the ion beam 95 reaches a target substrate disposed on platen 114. In the housing 122 of the PFG 115, the exit apertures 142 are positioned to allow the generated plasma to flow into contact with the ion beam 95. As the ion beam 95 impacts the platen 114, sputter 144 is generated, and redirected back towards the PFG 115. The sputter 144 may be received by a first main side 126 of the first shield 124.

In some embodiments, the first shield 124 includes one or more foam-like structures. Alternatively, the first shield 124 may include an exterior layer of foam 125, or may be made be made entirely from a foam material. Providing the first shield 124 as a foam-like component differs from convention solid structures used to line semiconductor equipment machines.

Although non-limiting, the first shield 124 may be conductive or non-conductive. For example, the first shield may be an aluminum foam, a silicon carbide (SiC) foam, an alumina foam, a graphite foam, and/or other conductive or nonconductive materials compatible with the chemistries and processes involved. In some cases, using a SiC foam may be more suitable in similar applications where aluminum may be insufficient. For example, aluminum foam is a cost-effective solution for lining regions insensitive to metals, while SiC coated foam can be used in places where aluminum foam results in excessive metals counts on the customer's wafer. The foams are capable of extending time between machine maintenance by capturing re-deposition coatings (e.g., sputter 144) resulting from the implant process. The sputter 144 is trapped within the layer of the foam 125 as opposed to sitting on the surface of the first shield 124 and other components of the assembly 116 where the sputter 144 is much more likely to flake off.

In some embodiments, various other components of the system 100 may be made from or coated with a conductive or nonconductive foam. For example, the layer of foam 125 may also be provided on one or more process chamber walls 127. The foam 125 acts as a liner for trapping the redeposited material, such as the sputter 144, significantly longer than liner materials and textures used in prior art approaches.

Figure 3:
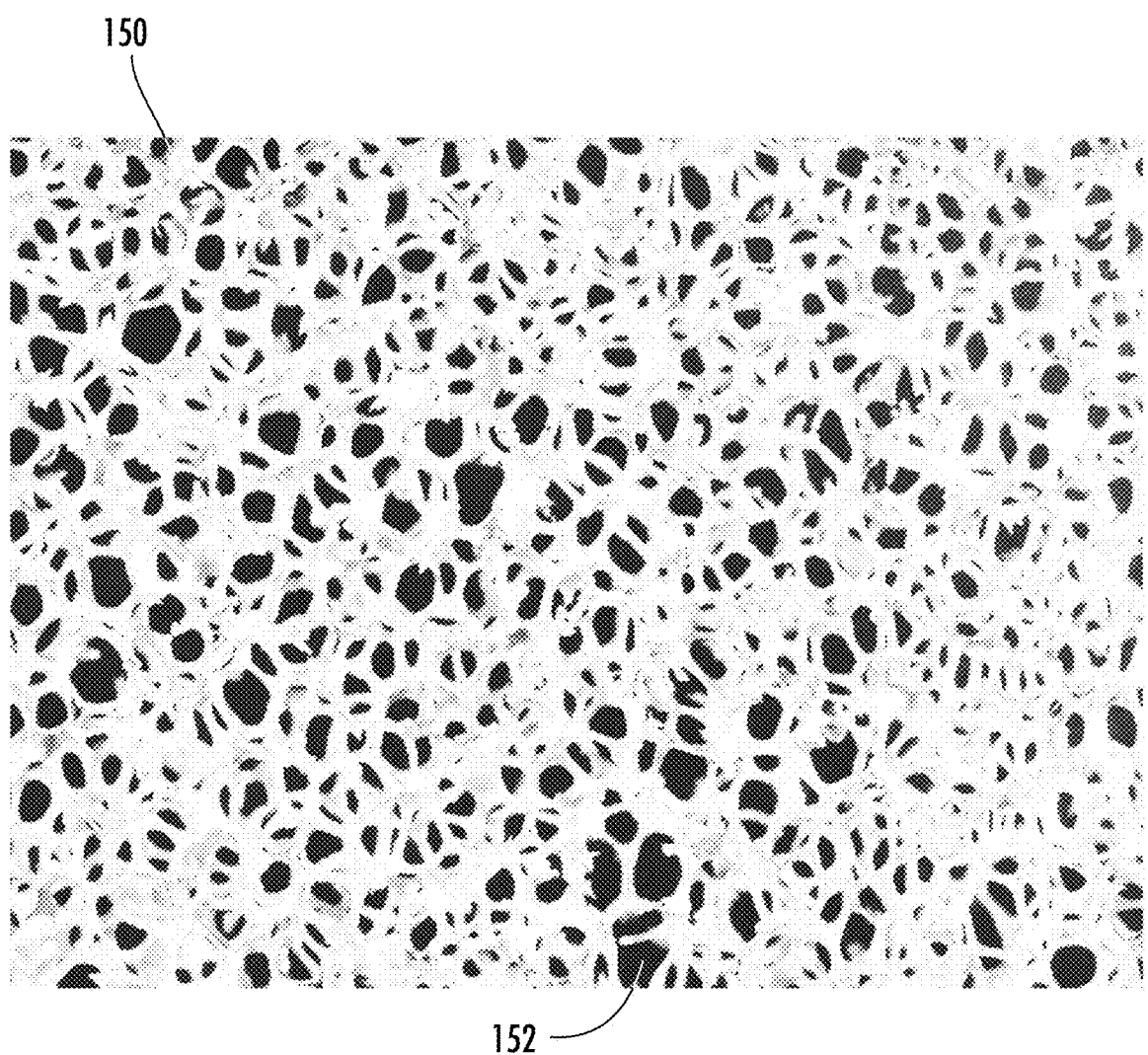
FIG. 3 is an example of a metal foam for use in the ion implanter system of FIG. 1 in accordance with embodiments of the present disclosure.

FIG. 3 demonstrates a non-limiting Al foam 150. The Al foam 150 may be the same or similar to the layer of foam 125 disposed along the first shield 124 and/or the process chamber walls 127 shown in FIG. 2. In some embodiments, the Al foam 150 is a metal foam manufactured from aluminum, and defining a plurality of pores 152. As used herein, the Al foam 150 is a foamed aluminum made from aluminum or an aluminum alloy having a large volume fraction of pores 152 or cells. The plurality of pores 152 may be disposed in fluid communication with each other to form an interconnected network, and define an open-cell foam. The foamed aluminum may include a very high porosity.

Each of the plurality of pores 152 includes a pore size. The shape of each of the plurality of pores 152 may be uniform, yet not limited to a spherical shape, or may vary between the different pores 152. As used herein, the pore size may be defined as the maximum distance across the void defined by each pore. For example, if the pore defines a spherical shape, then the pore size may be defined as the diameter of the sphere. Although, because the pores 152 may include a non-standard geometric shape, e.g., a non-spherical shape, one will appreciate the pores 152 may not define a diameter as generally understood. Accordingly, the pore size is defined herein as the maximum distance across the void defined by the specific pore. Preferably, the pore size of any of the plurality of pores 152 is between 0.1 mm and 4.0 mm. Although, one will appreciate the pore size may differ.

As noted above, the Al foam 150 includes a porosity, i.e., a pore density. As used herein, the pore density is the number of pores 152 per unit volume of the Al foam 150. The pore density may be uniform across a cross section of the Al foam 150. Alternatively, the pore density may vary across a cross section of the Al foam 150 to define a plurality of cross-sectional regions within the cross section of the Al foam 150.

Accordingly, each cross-sectional region of the Al foam 150 may include a different pore density than any adjacent cross-sectional region.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. Various features of the certain aspects, embodiments, or configurations of the disclosure may be combined in alternate aspects, embodiments, or configurations. Moreover, the following claims are hereby incorporated into the Detailed Description by reference, with each claim standing alone as a separate embodiment of the present disclosure.

As used herein, an element or step recited in the singular and proceeded with the word "a" or "an" is understood as not excluding plural elements or steps, unless such exclusion is explicitly recited. Furthermore, references to "one embodiment" of the present disclosure are not intended to be interpreted as excluding the existence of additional embodiments also incorporating the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions and are both conjunctive and disjunctive in operation. For example, expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are just used for identification purposes to aid the reader's understanding of the present disclosure. The directional references do not create limitations, particularly as to the position, orientation, or use of the disclosure. Connection references (e.g., attached, coupled, connected, and joined) are to be construed broadly and may include intermediate members between a collection of elements and relative movement between elements unless otherwise indicated. As such, connection references do not necessarily infer two elements are directly connected and in fixed relation to each other.

Furthermore, identification references (e.g., primary, secondary, first, second, third, fourth, etc.) are not intended to connote importance or priority, and are used to distinguish one feature from another. The drawings are for purposes of illustration, and the dimensions, positions, order and relative sizes reflected in the drawings attached hereto may vary.

Furthermore, the terms "substantial" or "approximately," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

As described herein, one will appreciate the disclosure provides at least the following technical benefits/advantages. Firstly, the foams are capable of extending time between machine maintenance by capturing re-deposition coatings (e.g., sputter) resulting from the implant process. The sputter is trapped within the layer(s) of the foam as opposed to sitting on the surface of the first shield and other components of the assembly where the sputter is much more likely to flake off. Secondly, use of the foam and shields increases time between preventative maintenance, thus improving cost of ownership. Unlike the prior art, wherein the material coating sensitive areas of the machine accumulates at a rate requiring excessive down-time to clean, the foam of the present disclosure allows greater accumulation of the sputtered material.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. An apparatus comprising:
    a plasma flood gun; and
    a shield assembly coupled to the plasma flood gun, the shield assembly comprising:
        a first shield having a first main side facing an ion beam target;
        a connection block coupled to a second main side of the first shield;
        a mounting plate coupled to the connection block; and
        a second shield coupled to the mounting plate by a bracket, the second shield extending beneath the mounting plate and a main body of the plasma flood gun.

2. The apparatus of claim 1, wherein the bracket is further coupled to a housing of the plasma flood gun.

3. The apparatus of claim 1, wherein the bracket is an L-shaped bracket.

4. The apparatus of claim 1, wherein the first shield and the mounting plate are oriented approximately perpendicular to one another.

5. The apparatus of claim 1, wherein the first shield includes a layer of foam material disposed along the first main side.

6. The apparatus of claim 5, wherein the foam material is one of: aluminum, silicon carbide, alumina, and graphite.

7. The apparatus of claim 1, wherein the plasma flood gun has a main body, and wherein the bracket is coupled to a housing of the main body.

8. The apparatus of claim 7, wherein the mounting plate partially surrounds a perimeter of the main body of the plasma flood gun.

9. The apparatus of claim 1, further comprising a layer of foam provided on one or more process chamber walls proximate the plasma flood gun, wherein the layer of foam is one of: a conductive material, and a nonconductive material.

10. A shield assembly for a plasma flood gun, comprising:
    a first shield having a first main side facing an ion beam target, the first shield including a foam material;
    a connection block coupled to a second main side of the first shield;
    a mounting plate coupled to the connection block; and a second shield coupled to the mounting plate by a bracket, wherein the bracket further couples together the mounting plate and a housing of the plasma flood gun, and wherein the second shield extends beneath the mounting plate and the housing of the plasma flood gun.

11. The shield assembly of claim 10, wherein the bracket is L-shaped.

12. The shield assembly of claim 10, wherein the first shield and the mounting plate are oriented approximately perpendicular to one another.

13. The shield assembly of claim 10, wherein the foam material is one of: aluminum, silicon carbide, alumina, and graphite.

14. The shield assembly of claim 10, wherein the mounting plate partially surrounds a perimeter of a main body of the plasma flood gun.

15. An apparatus comprising:
a plasma flood gun; and
a shield assembly coupled to the plasma flood gun, the shield assembly comprising:
a first shield having a first main side facing an ion beam target, wherein the first shield includes a foam material;
a connection block coupled to a second main side of the first shield;
a mounting plate coupled to the connection block; and
a second shield coupled to the mounting plate by a bracket, the second shield extending beneath the mounting plate and a main body of the plasma flood gun.

16. The apparatus of claim 15, wherein the bracket is further coupled to a housing of the plasma flood gun.

17. The apparatus of claim 15, wherein the bracket is an L-shaped bracket.

18. The apparatus of claim 15, wherein the first shield and the mounting plate are oriented approximately perpendicular to one another.

19. The apparatus of claim 15, wherein the foam material is one of: aluminum, silicon carbide, alumina, and graphite.

20. The apparatus of claim 15, the apparatus further comprising a process chamber, wherein a layer of foam is provided on one or more walls of the process chamber.

* * * * *